(12) United States Patent
Cho et al.

(10) Patent No.: US 9,184,411 B2
(45) Date of Patent: Nov. 10, 2015

(54) ORGANIC LIGHT EMITTING DIODE DISPLAY DEVICE

(71) Applicant: LG DISPLAY CO., LTD., Seoul (KR)

(72) Inventors: Seung Hyun Cho, Ulsan (KR); Byoung June Lee, Goyang-si (KR); Mi Youn Yang, Paju-si (KR); Sung Chul Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/313,661

(22) Filed: Jun. 24, 2014

(65) Prior Publication Data

US 2014/0374719 A1 Dec. 25, 2014

(30) Foreign Application Priority Data

Jun. 25, 2013 (KR) ........................ 10-2013-0072773

(51) Int. Cl.
*H01L 51/52* (2006.01)

(52) U.S. Cl.
CPC ........... *H01L 51/524* (2013.01); *H01L 51/5253* (2013.01)

(58) Field of Classification Search
CPC .................................................... H01L 51/524
USPC ............................................................ 257/40
See application file for complete search history.

(56) References Cited

U.S. PATENT DOCUMENTS

| 6,013,538 | A | * | 1/2000 | Burrows et al. ............... 438/22 |
| 2004/0037949 | A1 | * | 2/2004 | Wright ........................... 427/66 |
| 2009/0225047 | A1 | * | 9/2009 | Lee et al. ...................... 345/173 |

* cited by examiner

*Primary Examiner* — Edward Wojciechowicz
(74) *Attorney, Agent, or Firm* — Dentons US LLP

(57) ABSTRACT

An OLED display device with a passivation film formed between a sealing member and a pad portion through a structural alteration of the sealing member and first and second protective layers prevents deterioration of image quality and a driving faults caused by short circuits and electro-static discharge.

20 Claims, 10 Drawing Sheets

ORGANIC LIGHT EMITTING DIODE DISPLAY DEVICE

The present application claims priority under 35 U.S.C. §119(a) of Korean Patent Application No. 10-2013-0072773 filed on Jun. 25, 2013, which is hereby incorporated by reference for all purposes as if fully set forth herein.

BACKGROUND

1. Field of the Disclosure

The present application relates to an organic light emitting diode display device.

2. Discussion of the Related Art

Recently, a variety of flat panel display devices with reduced weight and volume corresponding to disadvantages of cathode ray tube (CRT) are being developed. The flat panel display devices include liquid crystal display (LCD) devices, field emission display (FED) devices, plasma display panels (PDPs), electroluminescent (EL) devices, and so on.

The electroluminescent devices are classified into an inorganic electroluminescent device and an organic light emitting diode (OLED) device on the basis of the formation material of a light emission layer. Such electroluminescent devices have features such as fast response time, high light emission efficiency, high brightness, and wide viewing angle because of using self-illuminating elements.

FIG. 1 is a mimetic diagram showing the configuration of an OLED.

As shown in FIG. 1, the OLED includes an organic electroluminescent compound layer configured to emit light in response to an electric field, and cathode and anode electrodes facing each other with the organic electroluminescent compound layer therebetween. The organic electroluminescent compound layer includes a hole injection layer HIL, a hole transport layer HTL, an light emission layer EML, an electron transport layer ETL, and an electron injection layer EIL. Such an OLED generates excitons by forcing electrons and electric-holes injected from the cathode and anode electrodes to be recombined with each other. Also, the OLED emits light using energies from the excitons which are transitioned from an excited state into the ground state.

The OLED is used in an OLED display device as a principal light emitting element. The organic electroluminescent compound layer is deteriorated by moisture and oxygen. As such, the OLED display device has a sealing structure shown in FIG. 2 to protect it from the environment. FIG. 2 is a cross-sectional view showing an OLED display device of the related art with a sealing structure.

The OLED display device of the related art includes an organic light emitting diode layer OLEDL on a substrate SUB. The organic light emitting diode layer OLEDL includes an organic electroluminescent compound layer EL (not shown). Also, the organic light emitting diode layer OLEDL is formed on a central area of the substrate SUB.

The OLED display device of the related art further includes pad portions PAD formed on edge areas of the substrate SUB. The pad portions PAD are used to receive and apply electrical signals from and to an external apparatus which is used to drive the OLED display device.

Also, the OLED display device of the related art includes a sealing glass substrate ENCAP that is combined with the substrate SUB using a sealant SEAL. The sealant SEAL is formed from an ultraviolet (UV) hardening resin material in boundary regions between the pad portions PAD and the organic light emitting diode layer OLEDL. The glass substrate ENCAP is used to prevent the intrusion of external moisture and oxygen and to protect the organic light emitting diode layer OLEDL.

Furthermore, because it is difficult to efficiently prevent the intrusion of external moisture using only the UV sealant SEAL, the OLED display device of the related art includes an absorbent GEL which is used to absorb intruded moisture and oxygen. The absorbent GEL is attached to a central region of the glass substrate over the organic light emitting diode layer OLEDL.

In this manner, the OLED display device of the related art protects the organic light emitting diode layer OLEDL using the absorbent and the sealant. However, a large-sized display device using the above-mentioned sealant GEL and sealing glass substrate ENCAP is limited in reliability.

Moreover, in order to ease interaction with a user, a flexible substrate may be used in the display device. To this end, it is necessary to develop a sealing member using a metal material rather than the glass substrate. Actually, a Korean patent publication number of 10-2011-0065777 discloses a thin flexible substrate, which is formed from a metal material, and a sealing member for efficiently protecting the organic light emitting diode layer. However, the sealing member that includes metal material can easily cause an electrical short between the pad portion and the OLEDL.

Meanwhile, the pad portion PAD can provide a path for transferring a variety of signals which are necessary to drive the organic light emitting diodes. The OLED display device includes a display area and a driving area. The display area is used to display images. The driving area has a driving portion which includes a variety of drivers used to drive the OLED display device. In detail, the driving portion includes a gate driver used to drive a plurality of gate lines, and a data driver used to drive a plurality of data lines. Also, the driving portion can include a timing controller used to control the gate driver and the data driver. Moreover, the driving portion can include a power supply portion used to supply a power voltage VDD to the gate and data drivers and the timing controller. The power supply portion derives the power voltage VDD from an input voltage Vin which is applied from an external power supply unit. In this manner, signal lines used to supply a variety of signals, which are necessary to drive the organic light emitting diodes, can be connected to a variety of drivers via the pad portions and a printed circuit board which is connected to the pad portions.

FIG. 3 is a planar view showing one area of the substrate in which a pad portion is formed. FIG. 4 is showing a burnt defect which is caused by a short circuit between a driving power pad VDD and a reference power pad VSS in the related art.

Referring to FIGS. 3 and 4, the pad portion is connected to a variety of electrodes on the substrate and used as a path for applying power voltages and a variety of signals, which control the display images, to the electrodes on the substrate. For example, the pad portion includes driving power pads VDD and reference voltage pads VSS that are formed on the substrate. Also, a sealant including a metal material can be formed on a region adjacent to the pad portion. In this case, a distance between the pad portion and the sealant is very small. Moreover, the distance between the pad portion and the sealant is further reduced by fabrication tolerances of each component. Due to this, an electrical short circuit can be generated between the pad portion and the sealant. If an electrical short circuit is generated between the pad portion and the sealant, the driving power pad VDD and the reference power pad VSS can be connected to each other. This condition can also increase the susceptibility of the OLED display device to electrostatic discharge (ESD). As such, an undesirable bright line, dark line, or driving fault can be generated.

BRIEF SUMMARY

Accordingly, embodiments of the present application are directed to an OLED display device that substantially obviates one or more of problems due to the limitations and disadvantages of the related art.

The embodiments relate to a sealant of a metal material as a sealing member used to protect an organic light emitting diode layer.

Also, the embodiments relate to a protective layer used to protect an organic light emitting diode layer.

Moreover, the embodiments relate to an OLED display device adapted to prevent faults due to a short circuit between a pad portion and a sealant.

Furthermore, the embodiments relate to an OLED display device adapted to decrease the non-display area and realize a narrower bezel in a product assembly.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the embodiments, an OLED display device includes: a substrate defined into a display area and a non-display area surrounding the display area; an organic light emission layer formed on the display area; a pad portion formed on the non-display area; a first protective layer configured to cover the organic light emission layer; a second protective layer configured to cover the first protective layer; a metal cap disposed on the second protective layer; and a photoresist layer disposed on the metal cap.

The OLED display device according to one general aspect of the present embodiments allows the photoresist layer to encompass an upper surface, side surfaces and rear surface edges of the metal cap.

The OLED display device according to one general aspect of the present embodiments further comprises a flexible printed circuit cable disposed on an upper surface of the photoresist layer and connected to the pad portion.

The OLED display device according to one general aspect of the present embodiments enables the non-display area to be defined into a first domain surrounding the display area, a second domain surrounding the first domain, a third domain surrounding the second domain, and a fourth domain surrounding the third domain. The first protective layer is opposite up to the first domain, the second protective layer is opposite up to the second domain, the metal cap is opposite up to the second domain, and the pad portion is disposed on the fourth domain.

In the OLED display device according to one general aspect of the present embodiments, the non-display area is defined into a first domain surrounding the display area, a second domain surrounding the first domain, a third domain surrounding the second domain, and a fourth domain surrounding the third domain. The first protective layer includes a first main-protective layer opposite to the display area and the first domain, and a first sub-protective layer disposed on the second and third domains. The second protective layer formed to cover the first main-protective layer in such a manner as to be opposite up to the second domain, the metal cap is opposite up to the first and second domains, and the pad portion is disposed on the fourth domain.

The OLED display device according to one general aspect of the present embodiments allows the first main-protective layer and the first sub-protective layer to be about the same height.

The OLED display device according to one general aspect of the present embodiments allows the first main-protective layer and the first sub-protective layer to be formed on the substrate through the same process.

The OLED display device according to one general aspect of the present embodiments further comprises a flexible printed circuit cable disposed on an upper surface of the photoresist layer and connected to the pad portion.

The OLED display device according to one general aspect of the present embodiments employs a flexible substrate as the substrate.

According to another general aspect of the embodiments, an OLED display device includes: a substrate defined into a display area and a non-display area which includes a first domain surrounding the display area, a second domain surrounding the first domain, a third domain surrounding the second domain, and a fourth domain surrounding the third domain; an organic light emission layer formed on the display area; a pad portion formed on the fourth domain; a first main-protective layer configured to cover the organic light emission layer in such a manner as to be opposite up to the first domain; a first sub-protective layer separated from the first main-protective layer and disposed on a boundary region of the second and third domains; a second protective layer configured to cover the first protective layer in such a manner as to be opposite up to a part of the second domain; a metal cap disposed on the second protective layer in such a manner as to be opposite up to the second domain; and a photoresist layer formed on exposed surfaces of the metal cap.

The OLED display device according to another general aspect of the present embodiments allows the photoresist layer to encompass an upper surface, side surfaces and rear surface edges of the metal cap.

The OLED display device according to another general aspect of the present embodiments further comprises a flexible printed circuit cable disposed on an upper surface of the photoresist layer and connected to the pad portion.

According to still another general aspect of the embodiments, an OLED display device includes: a substrate defined into a display area and a non-display area surrounding the display area; an organic light emission layer formed on the display area; a pad portion formed on the non-display area; a first protective layer configured to cover the organic light emission layer; a second protective layer configured to cover the first protective layer; and a metal cap disposed on the second protective layer. The non-display area is defined into a first domain surrounding the display area, a second domain surrounding the first domain, a third domain surrounding the second domain, and a fourth domain surrounding the third domain. The first protective layer is opposite up to the first domain, the second protective layer is opposite up to at least one of the second and third domains, the metal cap is opposite up to the second domain, and the pad portion is disposed on the fourth domain.

The OLED display device according to still another general aspect of the present embodiments allows the second protective layer to be opposite up to the third domain.

The OLED display device according to still another general aspect of the present embodiments further comprises a sub-protective layer disposed on a boundary region of the second and third domains. The second protective layer is opposite up to a part of the third domain.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION

Figure 1:
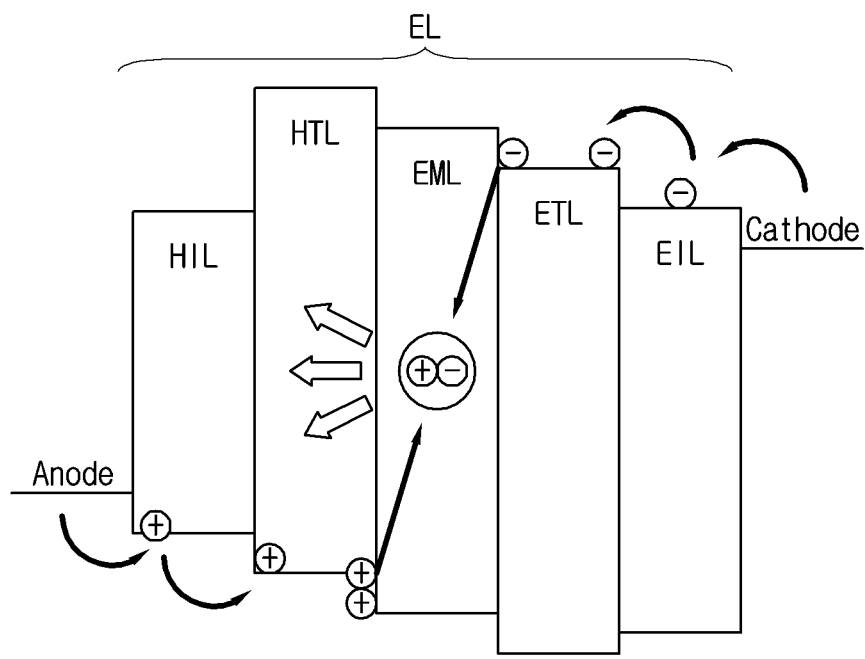
FIG. 1 is a mimetic diagram showing the configuration of an OLED in the related art.
Figure 2:
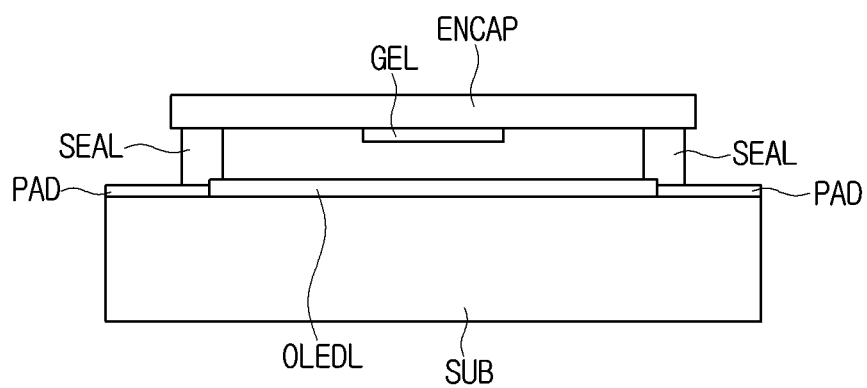
FIG. 2 is a cross-sectional view showing an OLED display device of the related art with a sealing structure.
Figure 3:
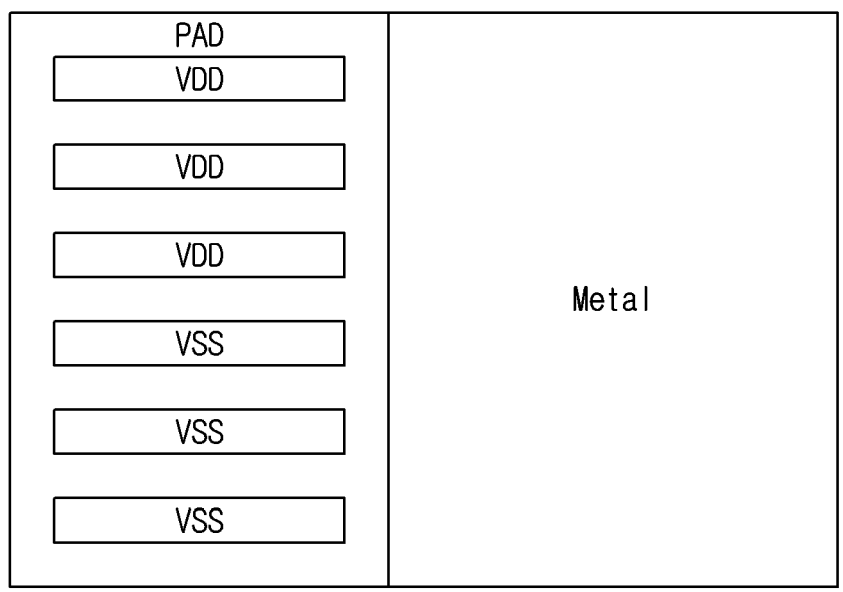
FIG. 3 is a planar view showing one area of the substrate in which a pad portion is formed in the related art.
Figure 4:
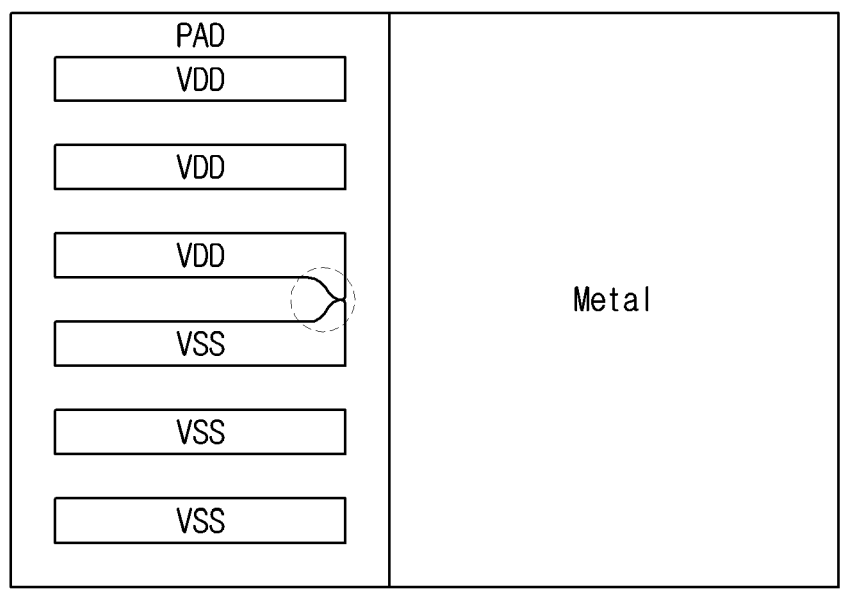
FIG. 4 is showing a burnt defect which is caused by a short circuit between a driving power pad VDD and a reference power pad VSS in the related art.

Reference will now be made in detail to an OLED display device in accordance with the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness, and so on of a device can be exaggerated for convenience of explanation. Wherever possible, the same reference numbers will be used throughout this disclosure including the drawings to refer to the same or like parts.

Figure 5:
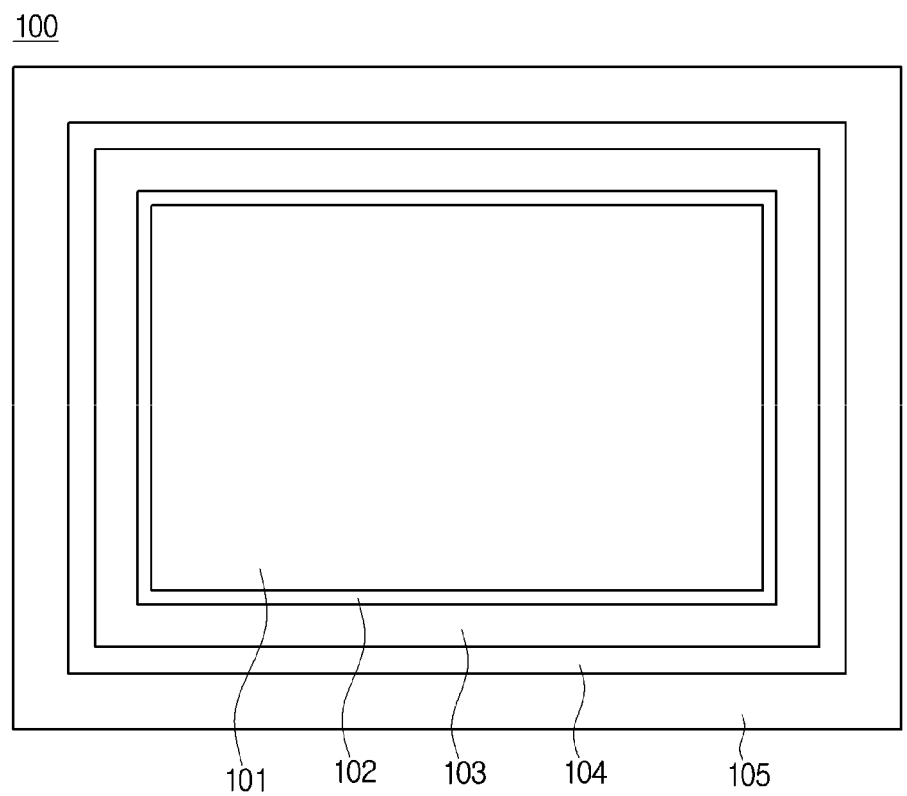
FIG. 5 is a planar view showing an upper surface of a substrate of an OLED display device according to a first exemplary embodiment of the present disclosure.
Figure 6:
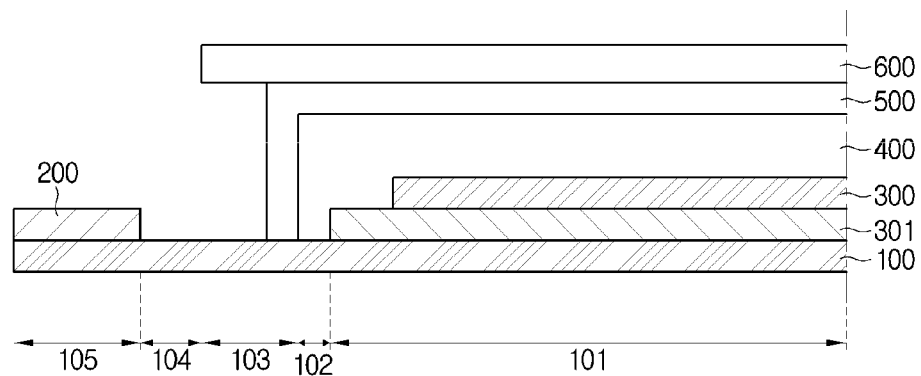
FIG. 6 is a cross-sectional view showing an OLED display device according to a first exemplary embodiment of the present disclosure.
Figure 7:
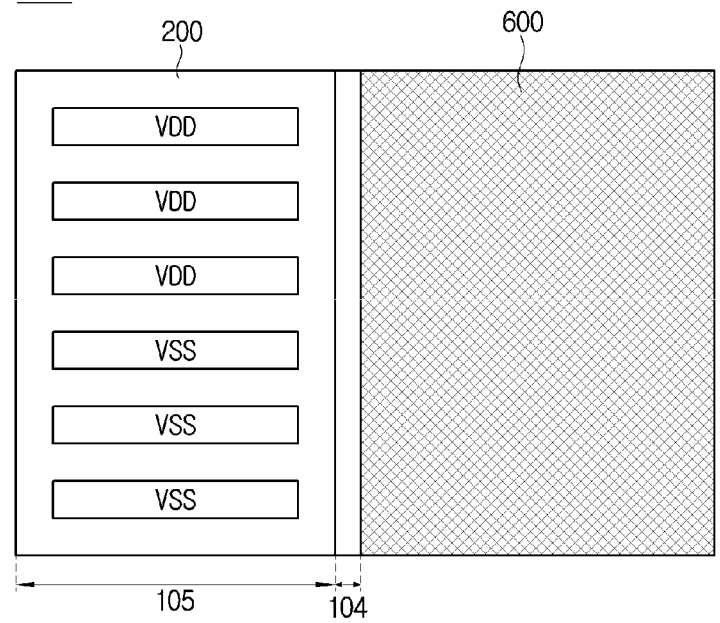
FIG. 7 is a planar view showing an upper surface of an OLED display device according to a first exemplary embodiment of the present disclosure.

FIG. 5 is a planar view showing an upper surface of a substrate of an OLED display device according to a first embodiment of the present disclosure. FIG. 6 is a cross-sectional view showing an OLED display device according to a first embodiment of the present disclosure. FIG. 7 is a planar view showing an upper surface of an OLED display device according to a first embodiment of the present disclosure.

Referring to FIGS. 5 and 7, a substrate 100 of the OLED display device 1000 according to an embodiment of the present disclosure can be defined into a display area 101 and a non-display area 102-105. The non-display area 102-105 can include first through fourth domains 102-105.

The first domain 102 can be defined in such a manner as to surround the display area 101. The second domain 103 can be defined in such a manner as to surround the first domain 102. The third domain 104 can be defined in such a manner as to surround the second domain 103. The fourth domain 105 can be defined in such a manner as to surround the third domain 104.

The substrate 100 can glass of a flat plate. For example, the substrate 100 can be one material of potash-lime glass, soda-lime glass, and quartz glass. Alternatively, a flexible substrate formed from a transparent material can be used as the substrate 100. However, the material of the substrate 100 is not limited to the above-mentioned glass materials. In other words, a thin metal substrate can be used as the substrate 100.

An organic light emission layer 300 is formed on the display area 101. Also, a first protective layer 400, a second protective layer 500, and a metal cap 600 can be sequentially formed in such a manner as to surround the organic light emission layer 300 that is formed on the display area 101. The first and second protective layers 400 and 500 and the metal cap 600 can overlap with at least one of the display area 101 and the first through fourth domains 102-105.

Moreover, a TFT (thin film transistor) layer 301 can be formed on the substrate 100. The TFT layer 301 includes pluralities of switching TFTs and driving TFTs which are used to drive the organic light emission layer 300. Also, the TFT layer 301 can further include gate lines, electro-magnetic (EM) lines, data lines, driving voltage lines, reference voltage lines, and capacitors (Cst). The organic light emission layer 300 can include an anode electrode, a hole injection layer, a light emission layer, an electron injection layer, and a cathode electrode that are sequentially formed on the substrate 100 provided with the TFT layer 301. The anode electrode can be a transparent electrode. Such an organic light emission layer 300 can be formed in a plurality of pixel regions within the display area 101. Also, the organic light emission layer 300 emits light by means of driving currents which are applied through the driving TFTs, thereby displaying image. Driving currents applied to the organic light emission layer 300 are generated to correspond with image data used to display an image.

The first protective layer 400, as a passivation layer, is used to planarize the surface of the substrate 100 and protect the organic light emission layer 300. The second protective layer 500 can be formed from a transparent adhesive material with a high light transmittance. For example, the second protective layer 500 can be formed from an adhesive film or an OCA (optical cleared adhesive). Such a second protective layer 500 can planarize the surface of the substrate 100 and protect the organic light emission layer 300 from external oxygen and/or moisture.

The metal cap 600 can be a thin metal plate and have a thickness of about 0.1 mm. The metal cap 600 can be attached to the upper surface of the second protective layer, to seal the organic light emission layer 300. In other words, the metal cap 600 can be used as a sealing member for protecting the organic light emission layer 300 in combination with the substrate 100. Such a metal cap 600 can prevent deterioration of the organic light emission layer 300 by moisture and oxygen. As such, deterioration of brightness, reduction of lifespan, and increments of black spots can be prevented.

Figure 8:
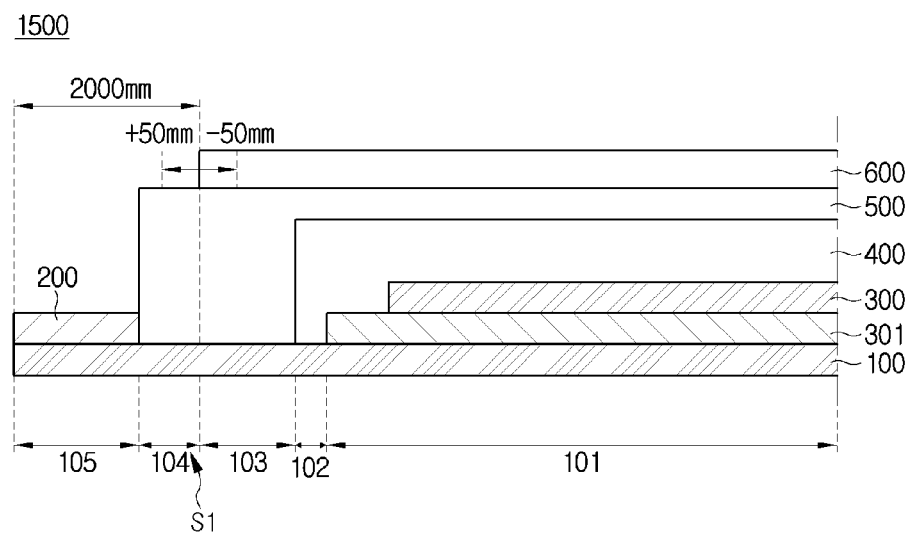
FIG. 8 is a cross-sectional view showing an OLED display device according to another aspect of the first exemplary embodiment of the present disclosure.
Figure 9:
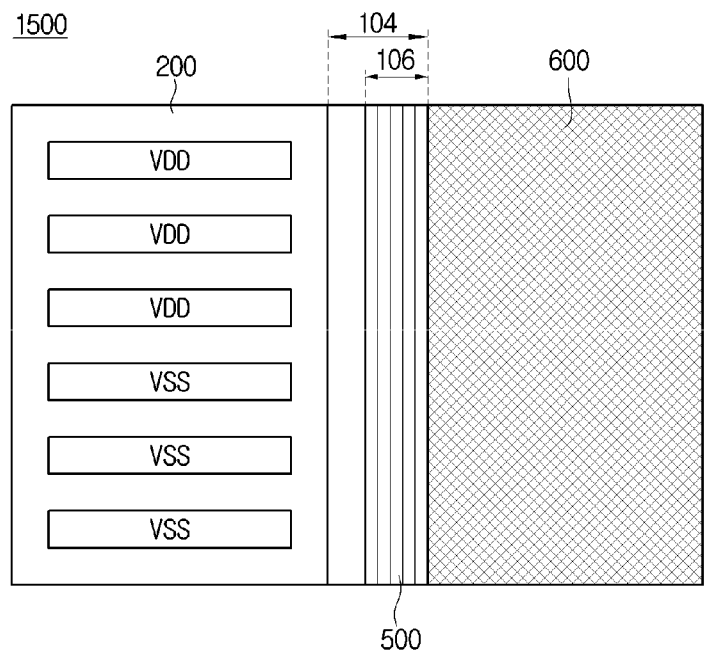
FIG. 9 is a planar view showing an upper surface of an OLED display device according to another aspect of the first exemplary embodiment of the present disclosure.

FIG. 8 is a cross-sectional view showing an OLED display device 1500 according to another aspect of the first embodiment of the present disclosure. FIG. 9 is a planar view showing an upper surface of an OLED display device according to this aspect of the first embodiment of the present disclosure.

Referring to FIGS. 8 and 9, an OLED display device 1500 according to a first embodiment of the present disclosure can include a substrate 100, a pad portion 200, an organic light emission layer 300, a TFT layer 301, a first protective layer 400, a second protective layer 500, and a metal cap 600.

The organic light emission layer 300 can be formed on the display area 101 of the substrate 100. The first protective layer 400 can be formed on an area that corresponds to the display area 101 and the first domain 102. The second protective layer 500 can be formed on an area that corresponds to the display area 101 and the first through third domains 102-104. The metal cap 600 can be formed on an area that corresponds to the display area 101 and the first and second domains 102 and 103. The pad portion 200 can be disposed on the fourth domain 105.

Although it is shown in the drawings that the metal cap 600 overlaps with only the display area 101 and the first and second domains 102 and 103, this aspect of the first embodiment of the present disclosure is not limited to this. Alternatively, the metal cap 600 can be also formed to have a size which covers up to the third domain 104. In this case, the metal cap 600 is preferable to have a size that does not overlap the fourth domain 105 and does not contact the pad portion 200, to prevent the generation of a short circuit between the metal cap 600 and the pad portion 200. In other words, the metal cap 600 is preferably separated from the pad portion 200 by a fixed distance in consideration of fabrication tolerances between the metal cap 600 and the pad portion 200.

In this manner, the second protective layer 500 is formed in a size that overlaps the third domain 104. As such, contact between the metal cap 600 and the pad portion 200 can be prevented. Because the generation of a short circuit between the pad portion 200 and the metal cap 600 is prevented, the widths of the first through fourth domains 102-105 defined as the non-display area can be reduced. Accordingly, the width of the non-display area can be reduced and correspond to a narrower bezel in an end display product.

The relationship of the components will now be described in detail by applying specific numerical values. The applied numerical values are used only to clearly explain the first embodiment of the present disclosure. As such, the present disclosure is not limited to the applied numerical values. In other words, the applied numerical values can depend on size, internal structure, and configuration of the OLED display device.

A total width of the third and fourth domains 104 and 105 can be about 2000 mm. In this case, a distance between the pad portion 200 disposed in the fourth domain 105 and the metal cap 600 is preferably about 191 mm. Also, a process tolerance of the metal cap 600 of ±50 mm can be set from a boundary line S1 between the second domain 103 and the third domain 104. In other words, the metal cap 600 can be formed in such a manner as to either overlap with only a part of the second domain 103 due to the tolerance of −50 mm, or overlap with a part of the third domain 104 due to the tolerance of +50 mm. If the tolerance of +50 mm is realized during the formation of the metal cap 600, not only the distance between the pad portion 200 and the metal cap 600 can be reduced to 141 mm, but also a combination tolerance of the metal cap 600 and the substrate 100 can be about +100 mm. As such, the distance between the metal cap 600 and the pad portion 200 can be more narrow, to about 41 mm. Meanwhile, the thickness of the metal cap 600 can be varied by product. However, the metal cap 600 is generally formed to have a thickness of about 0.1 mm. As such, edges of the metal cap 600 can be bent. Due to this, the distance between the metal cap 600 and the pad portion 200 can be reduced to below 41 mm. Also, the substrate 100 combined with the metal cap 600 can become a flexible substrate. In this case, when the substrate 100 is bent, the distance between the metal cap 600 and the pad portion 200 can be further reduced. Moreover, the substrate 100 can be spontaneously bent through a heat-hardening procedure which is used to seal the organic light emission layer 300. In detail, the substrate 100 can be spontaneously bent due to a difference between thermal expansion coefficients of the substrate 100 and the metal cap 600 when the substrate 100 cools down after a hardening treatment. Due to this, an edge of the metal cap 600 can come in contact with the pad portion 200. However, the second protective layer 500 expansively formed up to the third domain 104 enables the pad portion 200 and the metal cap 600 to be spatially separate from each other. In other words, the second protective layer 500 can serve as a passivation film. Therefore, faults due to the contact of the pad portion 200 and the metal cap 600 and the susceptibility to electro-static discharge can be prevented.

Such a second protective layer 500 can be formed to cover the whole of the third domain 104 as shown in FIG. 8, but it is not limited to this. Alternatively, the second protective layer 500 can be formed in such a manner as to be separate from the pad portion 200. In other words, the second protective layer 500 can be formed to overlap a part of the third domain 104 and separated from the pad portion 200.

Referring to FIG. 9, it can be seen that the second protective layer 500 is formed to overlap a part 106 of the second domain 103 and separated from the pad portion 200.

Figure 10:
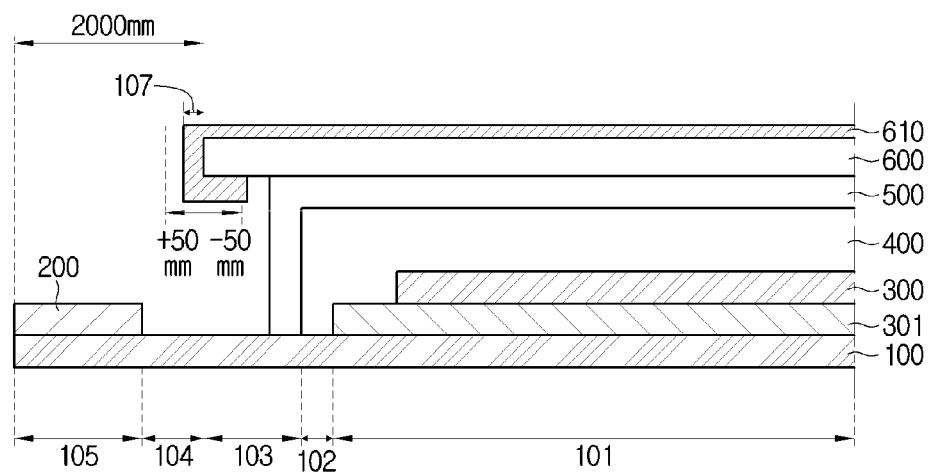
FIG. 10 is a cross-sectional view showing an OLED display device according to a second exemplary embodiment of the present disclosure.
Figure 11:
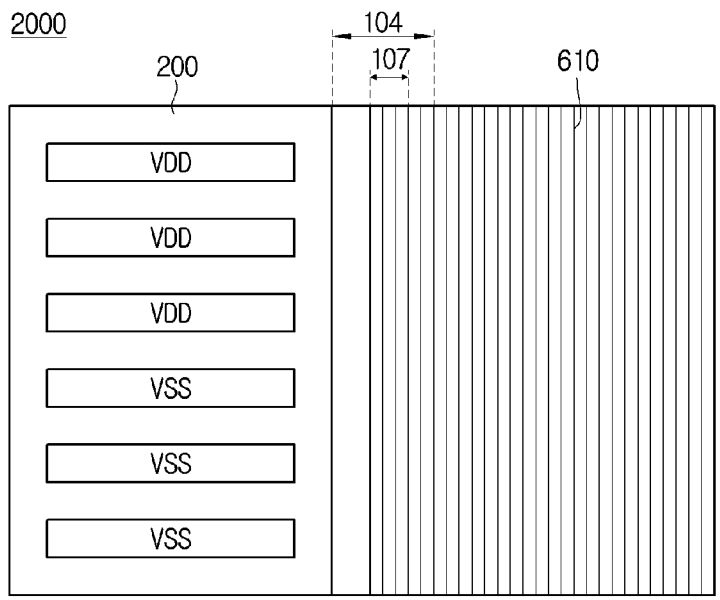
FIG. 11 is a planar view showing an upper surface of an OLED display device according to a second exemplary embodiment of the present disclosure.

FIG. 10 is a cross-sectional view showing an OLED display device 2000 according to a second embodiment of the present disclosure. FIG. 11 is a planar view showing an upper surface of an OLED display device 2000 according to a second embodiment of the present disclosure.

Components of the second embodiment having the same function and shape as those of the first embodiment will be referred to by the same reference numbers and names. Also, the description of features of the second embodiment similar to the first embodiment may be omitted.

Referring to FIGS. 10 and 11, an OLED display device 2000 according to a second embodiment of the present disclosure can include a substrate 100, a pad portion 200, an organic light emission layer 300, a TFT layer 301, a first protective layer 400, a second protective layer 500, a metal cap 600, and a photoresist layer 610.

The organic light emission layer 300 can be formed on the display area 101 of the substrate 100. The first protective layer 400 can be formed on an area which corresponds to the display area 101 and the first domain 102. The second protective layer 500 can be formed on an area which corresponds to the display area 101 and the first and second domains 102 and 103. The metal cap 600 can be formed on the area which corresponds to the display area 101 and the first and second domains 102 and 103. The pad portion 200 can be disposed on the fourth domain 105.

The photoresist layer 610 can be formed on the metal cap 600 as an insulation material. In detail, the photoresist layer 610 can be formed only on the upper surface of the metal cap 600. Alternatively, the photoresist layer 610 can also be formed on side surfaces and rear surface edges of the metal cap 600. The thickness of a side portion of the photoresist layer 610 formed on the side surface of the metal cap 600 is indicated by reference number '107' in the drawings.

Although it is shown in the drawings that the metal cap 600 overlaps with the display area 101 and the first and second domains 102 and 103, the second embodiment of the present disclosure is not limited to this. Alternatively, the metal cap 600 can be also formed to have a size which overlaps the third domain 104. As described above, it is preferable for the OLED display device of the embodiments to form the metal cap 600 to not overlap the fourth domain 105, to prevent the contact of the pad portion 200 to the metal cap 600 to eliminate a short circuit between the metal cap 600 and the pad portion 200. Meanwhile, the OLED display device 2000 according to a second embodiment of the present disclosure allows the photoresist layer 610 to be formed on the exposed surfaces of the metal cap 600 and used to prevent an electrical short circuit between the metal cap 600 and the pad portion 200. As such, an electrical short circuit between the metal cap 600 and the pad portion 200 can be prevented even though the metal cap 600 is formed to overlap the fourth domain 105. However, it is possible that the photoresist layer 610 can be formed on a part of the rear surface of the metal cap 600, not overlapping the second protective layer 500, due to a formation tolerance of the photoresist layer 610. In this case, if the metal cap 600 is formed up to the fourth domain 105, an exposed rear surface of the metal cap 600 can allow faults by being electrically shorted with the pad portion 200 and/or increase susceptibility to electro-static discharge. Accordingly, it is preferable to form the metal cap 600 in such a manner that the metal cap 600 does not overlap the fourth domain 105.

The relationship of the components in accordance with the second embodiment of the present disclosure will now be described in detail by applying specific numerical values. The applied numerical values are used only to clearly explain the second embodiment of the present disclosure. As such, the present disclosure is not limited to the applied numerical values. In other words, the applied numerical values can depend on size, internal structure and configuration of the OLED display device.

A total width of the combined third and fourth domains 104 and 105 can be set to about 2000 mm. In this case, a distance between the pad portion 200 disposed on the fourth domain 105 and the metal cap 600 can be about 191 mm corresponding to the width of the third domain 104. Also, in consideration of process variability of the metal cap 600, a tolerance of ±50 mm can be about boundary line S1 between the second domain 103 and the third domain 104. In other words, the metal cap 600 can be formed in such a manner as to either overlap with a part of the second domain 103 due to the tolerance of −50 mm, or overlap a part of the third domain 104 due to the tolerance of +50 mm. If the tolerance of +50 mm is realized during the formation of the metal cap 600, not only the distance between the pad portion 200 and the metal cap 600 can be reduced to 141 mm, but also a combination tolerance of the metal cap 600 and the substrate 100 can be about +100 mm. As such, the distance between the metal cap 600 and the pad portion 200 can be narrowed to about 41 mm.

Meanwhile, the thickness of the metal cap 600 can vary by product. However, the metal cap 600 is generally formed to have a thickness of about 0.1 mm. As such, edges of the metal cap 600 can be bent. Due to this, not only the distance between the metal cap 600 and the pad portion 200 can be reduced to below 41 mm, but also the possibility of generating an electrical short circuit between the metal cap 600 and the pad portion 200 can increase. These phenomena are not limited to a flat type substrate which cannot be bent. In order to increase involvement sense of a user, the metal cap 600 can be disposed on a flexible substrate. In this case, when the flexible substrate is bent, the distance between the metal cap 600 and the pad portion 200 can be further reduced. As such, the possibility of generating an electrical short circuit between the metal cap 600 and the pad portion 200 is increased. To address this situation, the third domain 104 must be enlarged to increase the distance between the pad portion 200 and the metal cap 600. This is contrary to the desire to minimize non-display area and associated bezel width of the display product. However, the OLED display device according to a second embodiment of the present disclosure can prevent the generation of an electrical short circuit between the metal cap 600 and the pad portion 200 and also reduce the width of the third domain 104, by disposing the photoresist layer 610 on the exposed surfaces of the metal cap 600. Accordingly, a narrow bezel can be realized, a user experience can be enhanced, and deterioration of image quality can be prevented.

Figure 12:
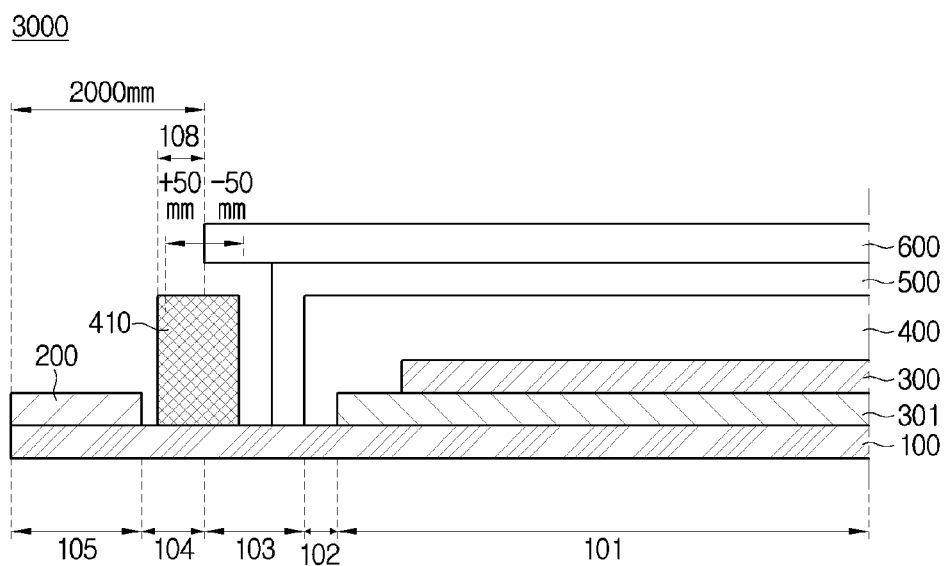
FIG. 12 is a cross-sectional view showing an OLED display device according to a third exemplary embodiment of the present disclosure.
Figure 13:
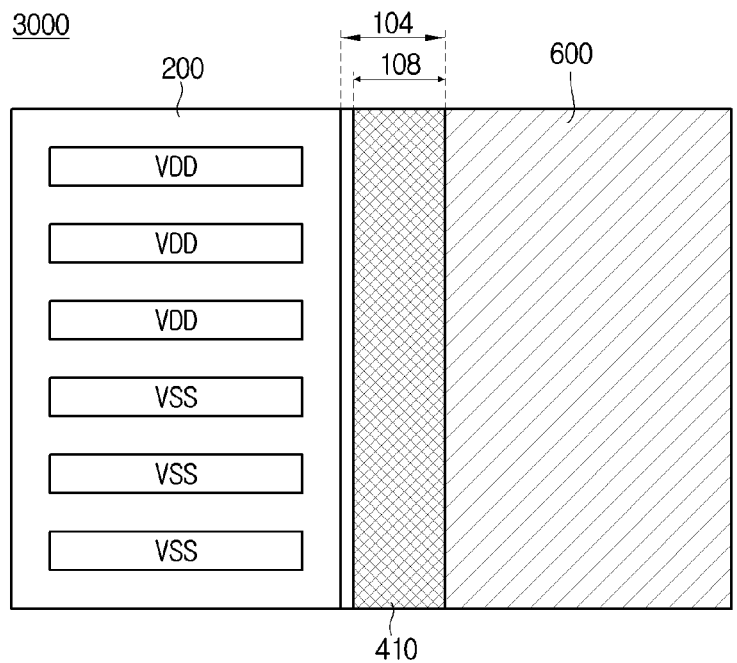
FIG. 13 is a planar view showing an upper surface of an OLED display device according to a third exemplary embodiment of the present disclosure.

FIG. 12 is a cross-sectional view showing an OLED display device 3000 according to a third embodiment of the present disclosure. FIG. 13 is a planar view showing an upper surface of an OLED display device 3000 according to a third embodiment of the present disclosure.

Components of the third embodiment having the same function and shape as those of the first and second embodiments will be referred to by the same reference numbers and names. Also, the description of the third embodiment similar to the first and second embodiments will be omitted.

Referring to FIGS. 12 and 13, an OLED display device 3000 according to a third embodiment of the present disclosure can include a substrate 100, a pad portion 200, an organic light emission layer 300, a TFT layer 301, a first main-protective layer 400, a first sub-protective layer 410, a second protective layer 500 and a metal cap 600.

The first sub-protective layer 410 can be formed on portions of the second and third domains 103 and 104. Although it is shown in the drawing that the first sub-protective layer 410 is formed on the second and third domains 103 and 104, it is not limited to this. Alternatively, the first sub-protective layer 410 can be formed only on the third domain 104. However, the third domain 104 can have a relatively narrow width. As such, the first sub-protective layer 410 can be formed on the second and third domains 103 and 104 to secure its stable deposition on the substrate 100. A distance from a side surface of the metal cap 600 to an outer side surface of the first sub-protective layer 410 facing the pad portion is indicated as 108 in the drawings.

The first main-protective layer 400 may be formed in the inner space of the second protective layer 500 and used to protect the organic light emission layer 300. The first sub-protective layer 410 formed on the second and third domains 103 and 104 can function as a passivation film decrease susceptibility to electro-static discharge and the potential for an electrical short circuit between the metal cap 600 and the pad 200. For example, the first sub-protective layer 410 used as a passivation film can prevent an electrical short circuit between the metal cap 600 and the pad 200 if the edge of the metal cap 600 sags toward the pad 200.

The first main-protective layer 400 and the first sub-protective layer 410 can be formed of the same material by the same process. Also, the first main-protective layer 400 and the first sub-protective layer 410 can be formed to about the same height.

Figure 14:
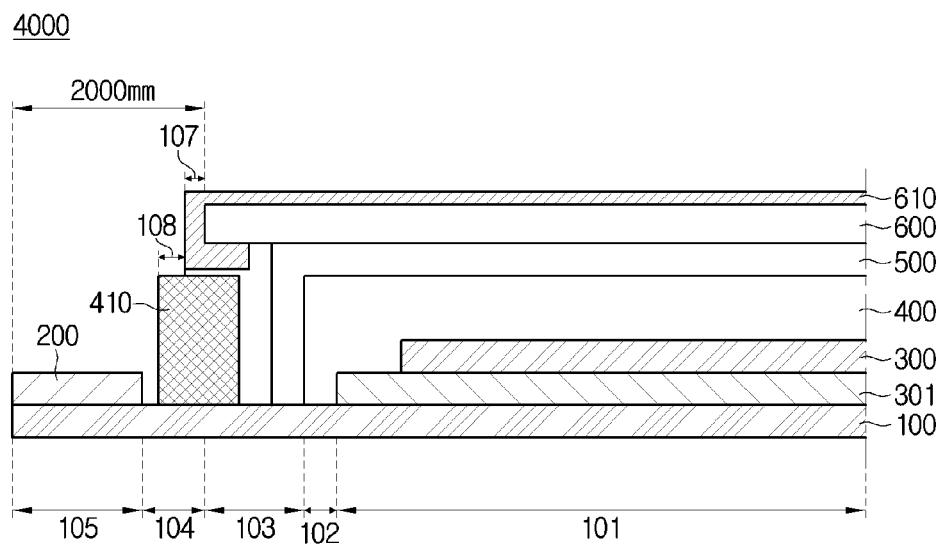
FIG. 14 is a cross-sectional view showing an OLED display device according to a fourth exemplary embodiment of the present disclosure.
Figure 15:
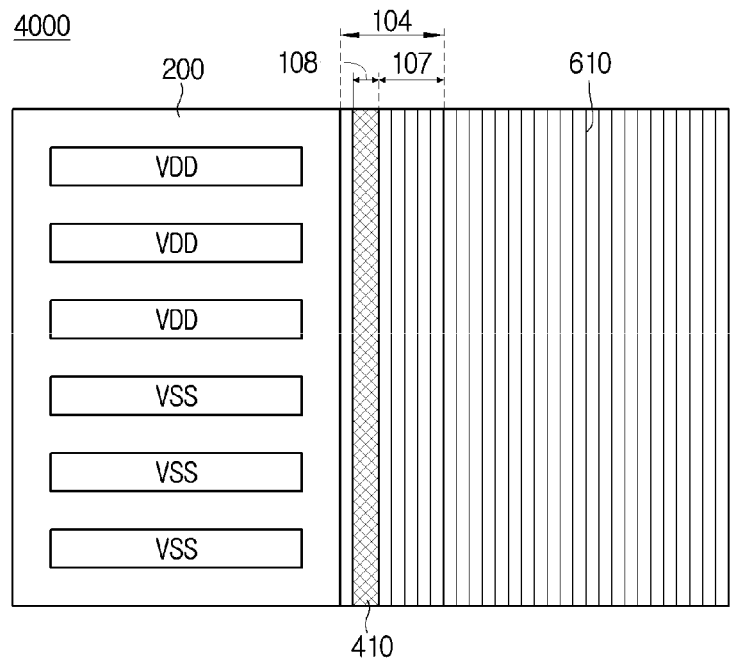
FIG. 15 is a planar view showing an upper surface of an OLED display device according to a fourth exemplary embodiment of the present disclosure.

FIG. 14 is a cross-sectional view showing an OLED display device 4000 according to a fourth embodiment of the present disclosure. FIG. 15 is a planar view showing an upper surface of an OLED display device 4000 according to a fourth embodiment of the present disclosure.

Components of the fourth embodiment having the same function and shape as those of the first through third embodiments will be referred to by the same reference numbers and names. Also, the description of the fourth embodiment similar to the first through third embodiments will be omitted.

Referring to FIGS. 14 and 15, an OLED display device 4000 according to a fourth embodiment of the present disclosure can include a substrate 100, a pad portion 200, an organic light emission layer 300, a TFT layer 301, a first main-protective layer 400, a first sub-protective layer 410, a second protective layer 500, a metal cap 600, and a photoresist layer 610.

The first sub-protective layer 410 formed on the second and third domains 103 and 104 can serve as a passivation film that primarily prevents an electrical short between the metal cap 600 and the pad 600. The photoresist layer 610 formed on the exposed surfaces of the metal cap 600 can be used to secondarily prevent deterioration of image quality caused by the generation of an electrical short circuit between the metal cap 600 and the pad portion 200. In this manner, the first sub-protective layer 410 and the photoresist layer 610 are used to doubly prevent the generation of an electrical short circuit between the metal cap 600 and the pad portion 200. As such, the generation of an electrical short between the metal cap 600 and the pad portion 200 can be fundamentally or completely prevented.

Figure 16:
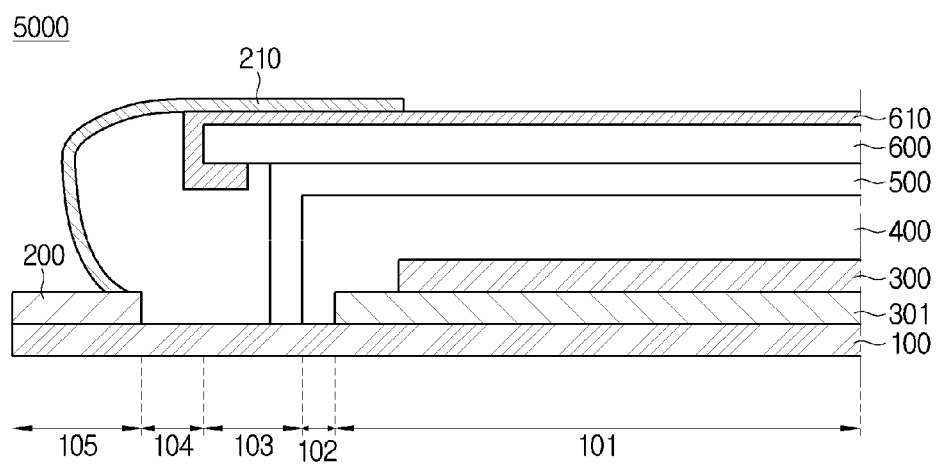
FIG. 16 is a cross-sectional view showing an OLED display device according to a fifth exemplary embodiment of the present disclosure.

FIG. 16 is a cross-sectional view showing an OLED display device 5000 according to a fifth embodiment of the present disclosure.

Components of the fifth embodiment having the same function and shape as those of the first through fourth embodiments will be referred to by the same reference numbers and names. Also, the description of the fifth embodiment similar to the first through fourth embodiments will be omitted.

Referring to FIG. 16, an OLED display device 5000 according to a fifth embodiment of the present disclosure can include a substrate 100, a pad portion 200, a printed circuit cable 210, an organic light emission layer 300, a TFT layer 301, a first protective layer 400, a second protective layer 500, a metal cap 600, and a photoresist layer 610.

The printed circuit cable 210 may be disposed on the upper surface of the photoresist layer 610 in such a manner to be connected to the pad portion 200. The printed circuit cable 210 can be a flexible printed circuit cable. Such a printed circuit cable 210 provides a signal path to transfer driving signals from a driver (not shown) to the TFT layer 301.

The photoresist layer 610 formed on the metal cap 600 can prevent the generation of an electrical short between the metal cap 600, the pad portion 200 and the printed circuit cable 210. As such, it is possible to dispose the printed circuit cable 210, which is connected to the pad portion 200, in an upward direction of the substrate 100. In detail, an electrical short circuit can be generated between the printed circuit cable 210 and the metal cap 600 because the printed circuit cable 210 is connected to the pad portion 200. Due to this, the printed circuit cable 210 must be bent in a rear direction of the substrate 100 and disposed on the rear surface of the substrate 100. However, the photoresist layer 610 formed on the exposed surfaces of the metal cap 600 encompasses the metal cap 600. In accordance therewith, the printed circuit cable 210 can be bent in an upward direction of the substrate 100 and disposed opposite to the upper surface of the substrate 100. In other words, the printed circuit cable 210 can be disposed on an upper surface of the photoresist layer 610. Therefore, the space for including the printed circuit cable 210 can be minimized.

Figure 17:
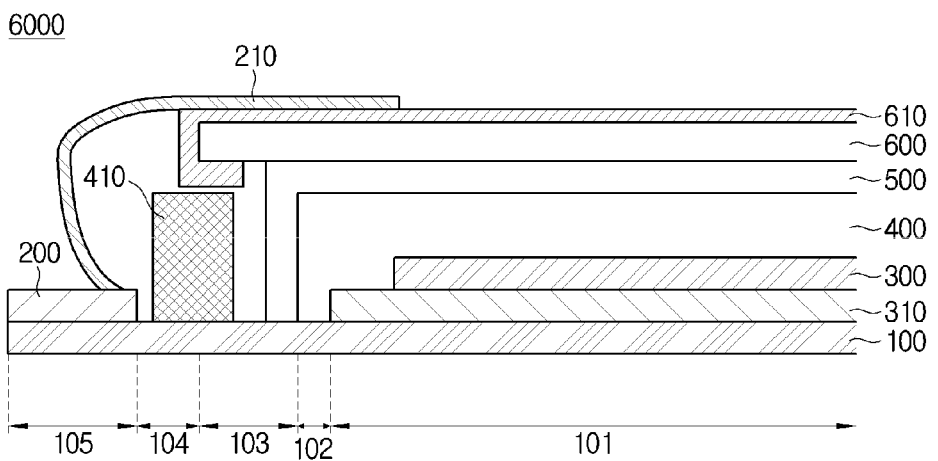
FIG. 17 is a cross-sectional view showing an OLED display device according to a sixth exemplary embodiment of the present disclosure.

FIG. 17 is a cross-sectional view showing an OLED display device 6000 according to a sixth embodiment of the present disclosure.

Components of the sixth embodiment having the same function and shape as those of the first through fifth embodiments will be referred to by the same reference numbers and names. Also, the description of the sixth embodiment similar to the first through fifth embodiments will be omitted.

Referring to FIG. 17, an OLED display device 6000 according to a sixth embodiment of the present disclosure can include a substrate 100, a pad portion 200, a printed circuit cable 210, an organic light emission layer 300, a TFT layer 301, a first main-protective layer 400, a first sub-protective layer 410, a second protective layer 500, a metal cap 600, and a photoresist layer 610.

The photoresist layer 610 formed on the metal cap 600 can prevent the generation of an electrical short phenomenon between the metal cap 600, the pad portion 200 and the printed circuit cable 210. As such, the printed circuit cable 210 can be bent in a direction, which encompasses an upper portion of the substrate 100, and disposed on the photoresist layer 610. In this case, the photoresist layer 610 and the first sub-protective layer 410 can prevent the generation of an electrical short between the metal cap 600 and the printed circuit cable 210.

As described above, the OLED display devices according to embodiments of the present disclosure allows a passivation film to be formed between the sealing member and the pad portion through a structural alteration of the sealing member and the first and second protective layers. Therefore, deterioration of image quality and driving faults caused by electrical short circuits or electro-static discharge can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the description of the present disclosure. It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device comprising:
   a substrate including a display area and a non-display area surrounding the display area;
   an organic light emission layer on the display area;
   a pad portion on the non-display area;
   a first protective layer covering the organic light emission layer;
   a second protective layer covering the first protective layer;
   a metal cap on the second protective layer; and
   a photoresist layer on the metal cap.

2. The organic light emitting diode display device of claim 1, wherein the photoresist layer covers an upper surface, a side surface, and edges of a rear surface of the metal cap.

3. The organic light emitting diode display device of claim 1, further comprising a cable on an upper surface of the photoresist layer, wherein a portion of the cable is electrically connected to the pad portion.

4. The organic light emitting diode display device of claim 1, wherein the non-display area includes a first domain which is from an end of the display area to an end of the first protective layer, a second domain which is from the end of the first protective layer to an end of the metal cap, a third domain which is between the end of the metal cap and the pad portion, and a fourth domain which is the pad portion, and
   wherein the first protective layer overlaps the first domain, the second protective layer overlaps the second domain, the metal cap overlaps the second domain, and the pad portion is in the fourth domain.

5. The organic light emitting diode display device of claim 1,
   wherein the first protective layer includes a first main-protective layer and a first sub-protective layer,
   wherein the non-display area includes a first domain which is from an end of the display area to an end of the first main-protective layer, a second domain which is from the end of the first main-protective layer to an end of the metal cap, a third domain which is between the end of the metal cap and the pad portion, and a fourth domain which is the pad portion,
   wherein the first main-protective layer is overlapping the display area and the first domain, and the first sub-protective layer is in the second and the third domains,
   wherein the second protective layer covers the first main-protective layer and overlaps the second domain,
   wherein the metal cap overlaps the first and the second domains, and
   wherein the pad portion is disposed in the fourth domain.

6. The organic light emitting diode display device of claim 5, wherein the first main-protective layer and the first sub-protective layer are about the same height.

7. The organic light emitting diode display device of claim 5, wherein the first main-protective layer and the first sub-protective layer are the same material.

8. The organic light emitting diode display device of claim 5, further comprising a cable on an upper surface of the photoresist layer, wherein a portion of the cable is electrically connected to the pad portion.

9. The organic light emitting diode display device of claim 1, wherein the substrate is a flexible substrate.

10. An organic light emitting diode display device comprising:
    a substrate including a display area and a non-display area including first, second, and third domains;
    an organic light emission layer in the display area;
    a pad portion in a fourth domain;
    a first main-protective layer covering the organic light emission layer and overlaps the first domain;
    a first sub-protective layer separated from the first main-protective layer and on a boundary region of the second and the third domains;
    a second protective layer covering the first protective layer and overlapping the second domain;
    a metal cap on the second protective layer and overlapping the second domain; and
    a photoresist layer on exposed surfaces of the metal cap,
    wherein the first domain is from an end of the display area to an end of the first main-protective layer, the second domain is from the end of the first main-protective layer to an end of the metal cap, the third domain is between the end of the metal cap and the pad portion, and
    wherein the fourth domain is the pad portion.

11. The organic light emitting diode display device of claim 10, wherein the first main-protective layer and the first sub-protective layer are about the same height.

12. The organic light emitting diode display device of claim 10, wherein the first main-protective layer and the first sub-protective layer are the same material.

13. The organic light emitting diode display device of claim 10, wherein the photoresist layer covers an upper surface, a side surface, and edges of a rear surface of the metal cap.

14. The organic light emitting diode display device of claim 10, further comprising a cable on an upper surface of the photoresist layer, wherein a portion of the cable is electrically connected to the pad portion.

15. The organic light emitting diode display device of claim 10, wherein the substrate is a flexible substrate.

16. An organic light emitting diode display device comprising:
    a substrate including a display area and a non-display area including first, second, and third domains;
    an organic light emission layer on the display area;
    a pad portion on the non-display area;
    a first protective layer covering the organic light emission layer;
    a second protective layer covering the first protective layer; and
    a metal cap on the second protective layer,
    wherein the first domain is from an end of the display area to an end of the first protective layer, the second domain is from the end of the first protective layer to an end of the metal cap, the third domain is between the end of the metal cap and the pad portion, and the fourth domain is the pad portion, and
    wherein the first protective layer overlaps the first domain, the second protective layer overlaps at least one of the second and the third domains, the metal cap overlaps the second domain, and the pad portion is in the fourth domain.

17. The organic light emitting diode display device of claim 16, wherein the second protective layer overlaps the third domain.

18. The organic light emitting diode display device of claim 16, further comprising a sub-protective layer on a boundary region of the second and the third domains,
wherein the second protective layer overlaps the third domain.

19. The organic light emitting diode display device of claim 18, wherein the first protective layer and the sub-protective layer are about the same height.

20. The organic light emitting diode display device of claim 16, wherein the substrate is a flexible substrate.

\* \* \* \* \*